United States Patent
Liu et al.

(10) Patent No.: US 8,705,274 B2
(45) Date of Patent: Apr. 22, 2014

(54) THREE-DIMENSIONAL MULTI-BIT NON-VOLATILE MEMORY AND METHOD FOR MANUFACTURING THE SAME

(75) Inventors: Ming Liu, Beijing (CN); Chenxi Zhu, Beijing (CN); Zongliang Huo, Beijing (CN); Feng Yan, Beijing (CN); Qin Wang, Beijing (CN); Shibing Long, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 164 days.

(21) Appl. No.: 13/376,925

(22) PCT Filed: Jun. 30, 2011

(86) PCT No.: PCT/CN2011/076632
§ 371 (c)(1),
(2), (4) Date: Dec. 8, 2011

(87) PCT Pub. No.: WO2012/000442
PCT Pub. Date: Jan. 5, 2012

(65) Prior Publication Data
US 2012/0275220 A1 Nov. 1, 2012

(30) Foreign Application Priority Data

Jun. 30, 2010 (CN) .......................... 2010 1 0223354
Jun. 30, 2010 (CN) .......................... 2010 1 0223356

(51) Int. Cl.
*G11C 16/04* (2006.01)
*H01L 21/336* (2006.01)

(52) U.S. Cl.
USPC .............. 365/185.03; 257/324; 257/E29.309; 257/E21.423; 438/261

(58) Field of Classification Search
None
See application file for complete search history.

(56) References Cited

U.S. PATENT DOCUMENTS

| 6,191,444 B1 | 2/2001 | Clampitt et al. ............. 257/315 |
| 2005/0169035 A1* | 8/2005 | Hsu et al. ..................... 365/120 |
| 2009/0180324 A1* | 7/2009 | Ramaswamy et al. ... 365/185.17 |
| 2010/0159657 A1 | 6/2010 | Arai et al. ..................... 438/268 |
| 2010/0171163 A1 | 7/2010 | Kim et al. ..................... 257/314 |

FOREIGN PATENT DOCUMENTS

CN 101859778 10/2010

OTHER PUBLICATIONS

Search Report from related application Serial No. PCT/CN2011/076632, dated Oct. 13, 2011, 5 pgs.
Written Opinion from related application Serial No. PCT/CN2011/076632, dated Sep. 26, 2011, 8 pgs.
* cited by examiner

*Primary Examiner* — Huan Hoang
*Assistant Examiner* — James G Norman
(74) *Attorney, Agent, or Firm* — Westman, Champlin & Koehler, P.A.

(57) ABSTRACT

The present disclosure relates to the field of microelectronics manufacture and memories. A three-dimensional multi-bit non-volatile memory and a method for manufacturing the same are disclosed. The memory comprises a plurality of memory cells constituting a memory array. The memory array may comprise: a gate stack structure; periodically and alternately arranged gate stack regions and channel region spaces; gate dielectric layers for discrete charge storage; periodically arranged channel regions; source doping regions and drain doping regions symmetrically arranged to each other; bit lines led from the source doping regions and the drain doping regions; and word lines led from the gate stack regions. The gate dielectric layers for discrete charge storage can provide physical storage spots to achieve single-bit or multi-bit operations, so as to achieve a high storage density. According to the present disclosure, the localized charge storage characteristic of the charge trapping layer and characteristics such as a longer effective channel length and a higher density of a vertical memory structure are utilized, to provide multiple storage spots in a single memory cell. Therefore, the storage density is improved while good performances such as high speed are ensured.

21 Claims, 12 Drawing Sheets

THREE-DIMENSIONAL MULTI-BIT NON-VOLATILE MEMORY AND METHOD FOR MANUFACTURING THE SAME

CROSS-REFERENCE TO RELATED APPLICATION

This Application is a Section 371 National Stage Application of International Application No. PCT/CN2011/076632, filed 30 Jun. 2011, not yet published, which claims priority to Chinese Application No. 201010223356.3, filed Jun. 30, 2010 and Chinese Application No. 201010223354.4, filed Jun. 30, 2010 and the contents of which are hereby incorporated by reference in their entirety.

TECHNICAL FIELD

The present disclosure relates to the field of microelectronics manufacture and memories, and particularly, to a three-dimensional multi-bit non-volatile memory, which has a three-dimensional integration characteristic and can store charges locally, and a method for manufacturing the same.

BACKGROUND

Nowadays, microelectronic products generally can be categorized into two groups, namely logic devices and memory devices. The memory devices are included in almost all of modern electronic products, and thus play a very important role in the microelectronics field. The memory devices generally can be categorized into volatile memories and non-volatile memories. The non-volatile memories are mainly characterized by that they can hold information stored for a long time even if powered down. The non-volatile memories have properties similar to those of Read-Only-Memories (ROMs), and also have very high access speeds. Furthermore, the non-volatile memories are easy to be erased and rewritten and have low power consumption.

Due to requirements of applications such as multimedia and mobile communications to large-capacity and low-power-consumption storage, the non-volatile memories, especially Flash memories, are sharing an increasing portion of the semiconductor device market, and thus are becoming a very important type of memories.

A conventional Flash memory is a silicon based non-volatile memory having a polysilicon-thin-film-floating-gate structure. Typically, the memory has an oxide layer serving as a tunneling dielectric layer, a defect on which will cause a fatal discharging channel. In contrast, a charge-trapping type memory utilizes a trapping layer having a localized charge storage characteristic to implement discrete charge storage. In the charge-trapping type memory, defects on a tunneling dielectric layer will only cause local charge leakage instead of fatal discharging channels, so that charges are more stably held. What is more important is that the localized charge storage characteristic can create a plurality of relatively independent physical storage spots in a single device, so as to implement multi-bit storage and thus improve the storage density. The conventional Flash memory uses a planar structure. Contrary, a memory with a vertical structure can make an effective use of side surfaces, resulting in vertical channels and thus increased channel areas, so as to achieve better device performances.

With the rapid development of the microelectronics technology, semiconductor devices continue scaling down. In addition to continuously increased requirements on programming, erasing, and holding performances of the non-volatile memories, high storage densities, which enable a lower cost, have also become a focus. The three-dimensional integration technology is one of several effective methods for improving the storage density. US patent U.S. Pat. No. 5,825,296 describes a three-dimensional read-only-memory. Patent Application US 2008/0,023,747 discloses a semiconductor memory array based on a multi-stack structure and a method for manufacturing the same. However, the memories described in those two documents have the storage densities still lower than what is required in practice. Therefore, how to improve the storage density is still an important topic in the non-volatile memory research field.

SUMMARY

The present disclosure provides, among other things, a three-dimensional multi-bit non-volatile memory and a method for manufacturing the same, by which it is possible to improve the storage density and achieve a multi-bit memory with superior performances.

According to an embodiment, there is provided a three-dimensional multi-bit non-volatile memory, comprising a plurality of memory cells constituting a memory array. The memory array may comprise: a gate stack structure; periodically and alternately arranged gate stack regions and channel region spaces; gate dielectric layers for discrete charge storage; periodically arranged channel regions; source doping regions and drain doping regions symmetrically arranged to each other; bit lines led from the source doping regions and the drain doping regions; and word lines led from the gate stack regions. In the memory, the gate dielectric layers for discrete charge storage can provide physical storage spots to achieve single-bit or multi-bit operations, so as to achieve a high storage density.

The gate stack structure may be formed by stacking isolating dielectric layers and conductive gate layers alternately. The isolating dielectric layer may comprise silicon dioxide. The conductive gate layer may comprise any one of polysilicon, metal, metal silicide, and a stack of multiple layers.

The periodically and alternately arranged gate stack regions and channel region spaces may be formed by etching the gate stack structure. The etching may comprise: defining a pattern of the gate stack regions with photo resist or a hard mask; and etching the gate stack structure until a dielectric layer is exposed, so as to form the periodically and alternately arranged gate stack regions and channel region spaces.

The gate dielectric layers for discrete charge storage may be positioned on side walls of the respective gate stack regions adjacent to the respective channel regions. The gate dielectric layers for discrete charge storage each may comprise a charge block layer, a charge storage layer, and a tunneling dielectric layer formed in sequence on the side walls of the respective gate stack regions. The charge block layer may comprise any one of silicon dioxide, metal oxide, and a stack of multiple layers. The charge storage layer may comprise any one of silicon nitride, a high-K material, and a stack of multiple layers. The tunneling dielectric layer may comprise any one of silicon dioxide, a high-K material, and a stack of multiple layers. The memory may be programmed by Channel Hot Electron Injection (CHE), in which electrons enter the charge storage layer under the gate from a substrate side. The memory cells may be erased by an FN gate erasing operation, in which stored electrons tunnel from the charge storage layer into the gate stack structure of the memory array, or by Band-Band Tunneling Hot Hole Injection (BBTH), in which hot holes enter the charge storage layer from a substrate side to recombine with electrons.

The periodically arrange channel regions may be formed by depositing polysilicon in the channel region spaces, each of which is located between two adjacent tunneling dielectric layers, to completely fill the channel region spaces.

The symmetrically arranged source doping regions and drain doping regions may have a doping type opposite to that of the channel regions. The symmetrically arranged source doping regions and drain doping regions may be heavily doped in a doping condition substantially same as that of the channel regions. The symmetrically arranged source doping regions and drain doping regions may be distributed periodically along the channel regions. The symmetrically arranged source doping regions and drain doping regions may comprise doped polysilicon or metal silicide.

According to a further embodiment, there is also provided a method for manufacturing a three-dimensional multi-bit non-volatile memory. The method may comprise: forming a gate stack structure on a semiconductor substrate; etching the gate stack structure to form gate stack regions and channel region spaces which are periodically and alternately arranged; depositing a charge block layer, a charge storage layer, and a tunneling layer on side walls of the respective gate stack regions, to form gate dielectric layers for discrete charge storage; depositing polysilicon in the channel region spaces, each of which is located between adjacent portions of the tunneling dielectric layer, to form periodically arranged channel regions; etching the channel regions in a direction perpendicular to the channel regions, to form a plurality of periodically arranged locations for source doping regions and drain doping regions; depositing a source/drain doping material in the locations for source doping regions and drain doping regions, to form source doping regions and drain doping regions symmetrically arranged to each other; and leading bit lines from the locations for source doping regions and drain doping regions, and leading word lines from the gate stack regions, to form the three-dimensional multi-bit non-volatile memory.

Forming the gate stack structure on the semiconductor substrate may comprise: depositing a dielectric layer to achieve buffering and isolation on the semiconductor substrate by chemical vapor deposition; and depositing isolating dielectric layers and conductive gate layers alternately on the dielectric layer by chemical vapor deposition, to form the gate stack structure.

The semiconductor substrate may comprise any one of a silicon chip, a germanium-silicon chip, and a multilayer substrate including an epitaxial silicon or germanium-silicon layer. The dielectric layer may comprise silicon dioxide. The gate stack structure may comprise the alternately stacked isolating dielectric layers and conductive gate layers. The isolating dielectric layers may comprise silicon dioxide, and the conductive gate layer may comprise any one of polysilicon, metal, metal silicide, or a stack of multiple layers that has similar properties.

Etching the gate stack structure to form gate stack regions and channel region spaces which are periodically and alternately arranged may comprises: defining a pattern of the gate stack regions with photo resist or a hard mask; and etching the gate stack structure until the dielectric layer is exposed, so as to form the periodically and alternately arranged gate stack regions and channel region spaces.

Depositing the charge block layer, the charge storage layer, and the tunneling layer on the side walls of the respective gate stack regions to form the gate dielectric layers for discrete charge storage may comprise: depositing the charge block layer, the charge storage layer, and the tunneling layer on the gate stack structure, which has been etched to form the gate stack regions and the channel region spaces alternately arranged; forming the gate dielectric layers for discrete charge storage by etching the charge block layer, the charge storage layer, and the tunneling layer deposited on the gate stack regions and the dielectric layer, in such a manner that the uppermost isolating dielectric layer and the substrate are exposed, while portions of the charge block layer, the charge storage layer, and the tunneling layer, which are formed in sequence on the side walls of the respective gate stack regions, are remained.

Depositing polysilicon in the channel region spaces, each of which is located between adjacent portions of the tunneling dielectric layer, to form periodically arranged channel regions may comprise: depositing the polysilicon in the channel region spaces, each of which is located between adjacent portions of the tunneling dielectric layer, to completely fill the channel region spaces, so as to form the periodically arranged channel regions.

Etching the channel regions in the direction perpendicular to the channel regions to form the plurality of periodically arranged locations for source doping regions and drain doping regions may comprise: defining a pattern of the locations for source doping regions and drain doping regions with photo resist or a hard mask; etching the channel regions in the direction perpendicular to the channel regions until the substrate is exposed, so as to form a plurality of square holes periodically arranged in the channel regions, as the locations for source doping regions and drain doping regions.

Depositing a source/drain doping material in the locations for source doping regions and drain doping regions to form the source doping regions and the drain doping regions symmetrically arranged to each other may comprise: depositing the source/drain doping material in the locations for source doping regions and drain doping regions, and planarizing a surface thereof by chemical mechanical polishing, so as to form the source doping regions and the drain doping regions which are arranged symmetrically with respect to each other and periodically along the channel regions.

The method may further comprise: forming monocrystal silicon in the channel regions, the source doping regions, and the drain doping regions by a thermal treatment, after the formation of the symmetrically arranged source doping regions and drain doping regions.

In the step of leading bit lines from the locations for source doping regions and drain doping regions, and leading word lines from the gate stack regions, to form the three-dimensional multi-bit non-volatile memory, the bit lines may be led from the source doping regions and the drain doping regions and may be arranged in a direction perpendicular to the channel regions, and the word lines may be led from the gate stack regions and may be arranged in a direction parallel to the channel regions.

The bit line may comprise any one of polysilicon, metal, metal silicide, and a stack of multiple layers that has similar properties. The word line may comprise any one of polysilicon, metal, metal silicide, and a stack of multiple layers that has similar properties.

The present disclosure may achieve at least or in part the following advantageous effects.

The three-dimensional multi-bit non-volatile memory and the manufacturing method thereof according to the present disclosure utilize a localized charge storage characteristic of a charge trapping layer and characteristics such as a longer effective channel length and a higher density of a vertical memory structure, to provide multiple physical storage spots in a single memory cell. In this way, the memory array can achieve multi-bit storage and three-dimensional integration.

Therefore, the storage density is improved significantly while good performances such as high speed are ensured.

The three-dimensional multi-bit non-volatile memory and the manufacturing method thereof according to the present disclosure is compatible with the conventional silicon based planar CMOS processes, and thus the memory can be integrated as conventional memory arrays, which facilitates wide applications of the present disclosure.

DETAILED DESCRIPTION

The present disclosure will be described in more detail in connection with specific embodiments with reference to the drawings, to make objects, technical solutions, and advantages thereof more apparent.

FIG. 1 to FIG. 10 are schematic diagrams illustrating a process for manufacturing a three-dimensional multi-bit non-volatile memory according to embodiments of the present disclosure, which will be described in detail hereinafter.

Figure 1:
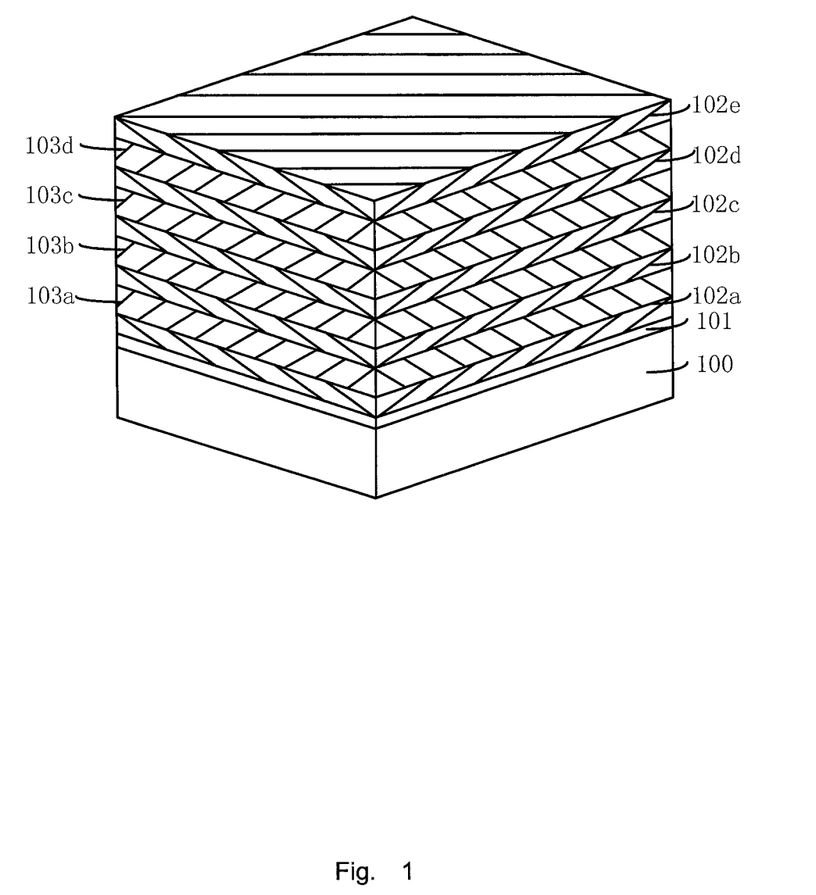
FIG. 1 is a schematic diagram illustrating a process for forming a gate stack structure on a semiconductor substrate according to an embodiment of the present disclosure.

FIG. 1 is a schematic diagram illustrating a process for forming a gate stack structure on a semiconductor substrate according to an embodiment of the present disclosure. The semiconductor substrate 100 may comprise any one of a silicon chip, a germanium-silicon chip, any other similar semiconductor material, and a multilayer substrate including an epitaxial silicon or germanium-silicon layer. A dielectric layer 101 may comprise silicon dioxide or other materials having similar properties, and is provided to achieve buffering and isolation. Layers 102a, 102b, 102c, 102d, and 102e are isolating dielectric layers, and may comprise silicon dioxide or other materials having similar properties. Layers 103a, 103b, 103c, and 103d are conductive gate layers, and may comprise any one of polysilicon, metal, metal silicide, and a stack of multiple layers that has similar properties. As shown in the figure, the isolating dielectric layers and the conductive gate layers are stacked alternately, so as to form the gate stack structure. This process may be performed by means of, for example, Chemical Vapor Deposition (CVD), etc.

Figure 2:
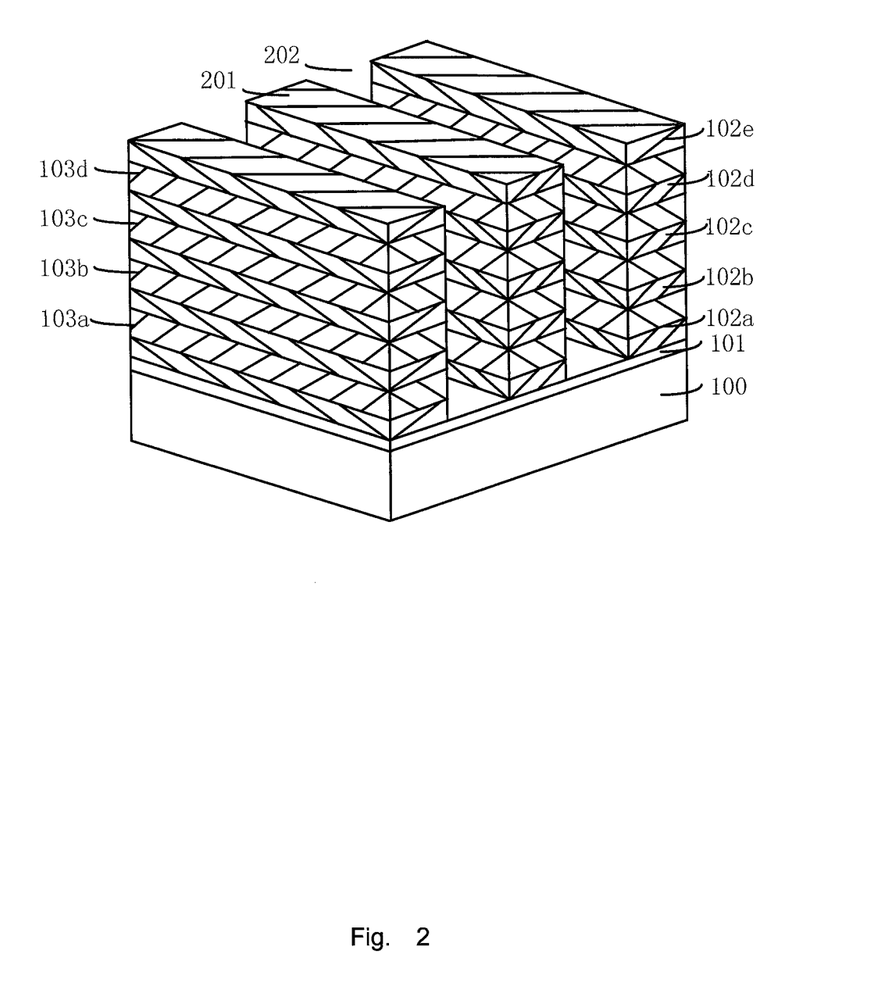
FIG. 2 is a schematic diagram illustrating a process for etching the gate stack structure according to an embodiment of the present disclosure.

FIG. 2 is a schematic diagram illustrating a process for etching the gate stack structure according to an embodiment of the present disclosure. A pattern of gate stack regions 201 is defined with photo resist or a hard mask, etc. The gate stack structure is etched until the dielectric layer 101 is exposed, resulting in periodically arranged gate stack regions 201 and opened channel region spaces 202.

Figure 3:
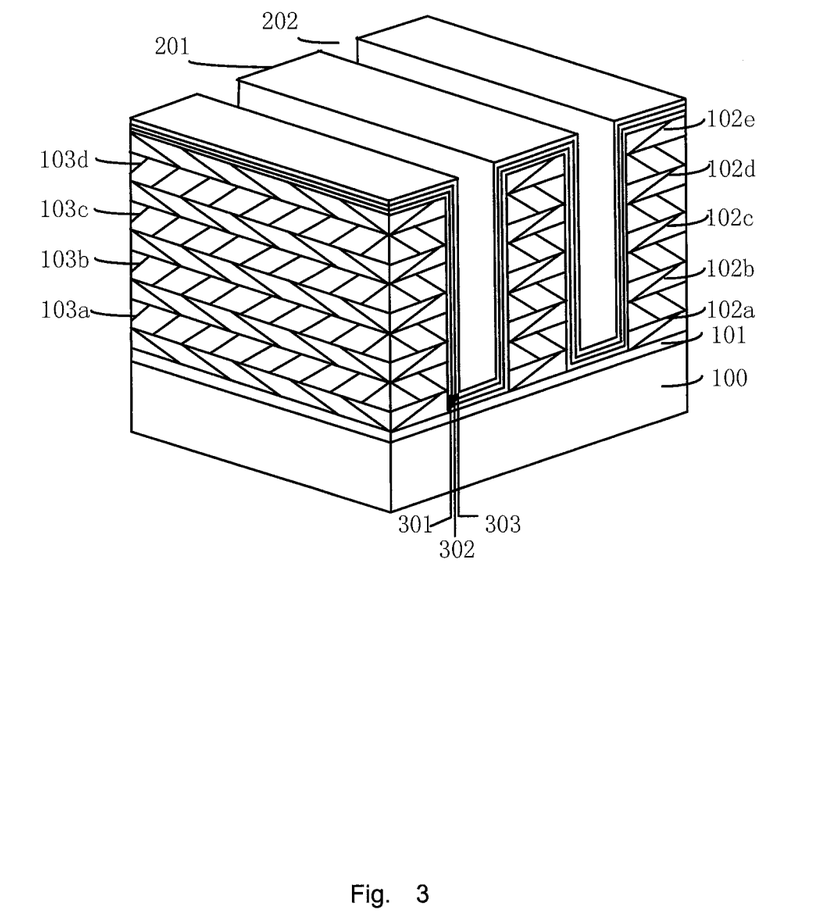
FIG. 3 is a schematic diagram illustrating a process for depositing a gate dielectric layer for discrete charge storage after the etching of the stack structure according to an embodiment of the present disclosure.

FIG. 3 is a schematic diagram illustrating a process for depositing a gate dielectric layer for discrete charge storage after the etching of the stack structure according to an embodiment of the present disclosure. The gate dielectric layer for discrete charge storage can be formed by depositing a charge block layer 301, a charge storage layer 302, and a tunneling dielectric layer 303 sequentially on sides of the gate stack regions 201. The charge block layer 301 may comprise any one of silicon dioxide, metal oxide, any other material having similar properties, and a stack of multiple layers that has similar properties. The charge storage layer 302 may comprise any one of silicon nitride, a high-K material, and any other material or stack having a charge storage capability. The tunneling dielectric layer 303 may comprise any one of silicon dioxide, a high-K material, any other material having similar properties, and a stack of multiple layers that has similar properties. In this process, the adopted processing method and the thicknesses of the respective layers may be adjusted in accordance with the materials being used.

Figure 4:
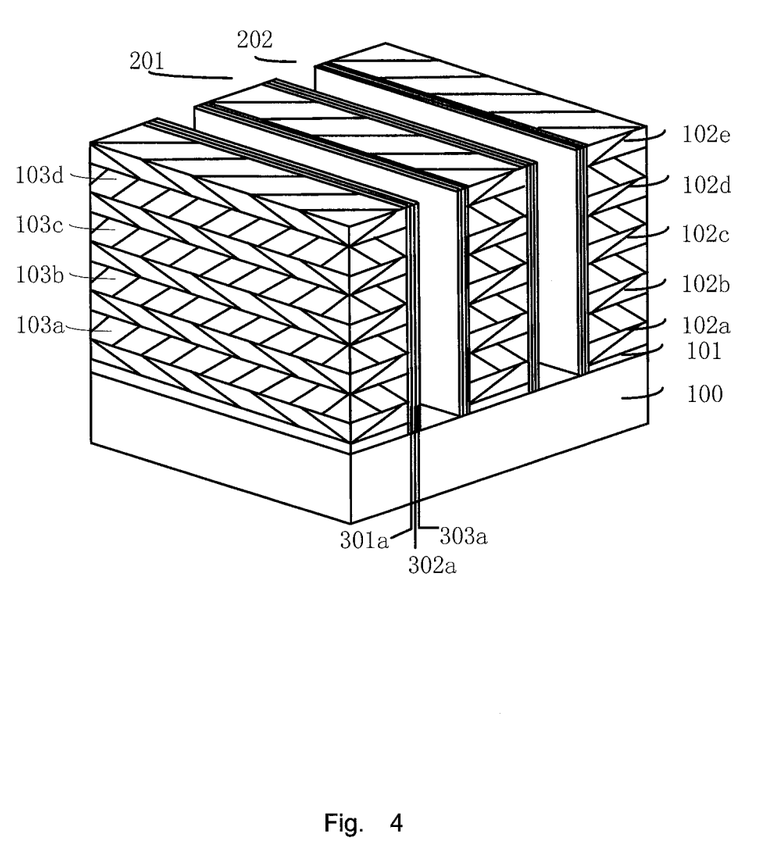
FIG. 4 is a schematic diagram illustrating a process for etching the gate dielectric layer for discrete charge storage deposited on gate stack regions and a dielectric layer according to an embodiment of the present disclosure.

FIG. 4 is a schematic diagram illustrating a process for etching the gate dielectric layer for discrete charge storage deposited on the gate stack regions 201 and the dielectric layer 101 according to an embodiment of the present disclosure. Due to the etching, the uppermost isolating dielectric layer 102e and the substrate 100 are exposed, while portions of the charge block layer 301, the charge storage layer 302, and the tunneling dielectric layer 303 formed sequentially on side walls of the gate stack regions, are remained.

Figure 5:
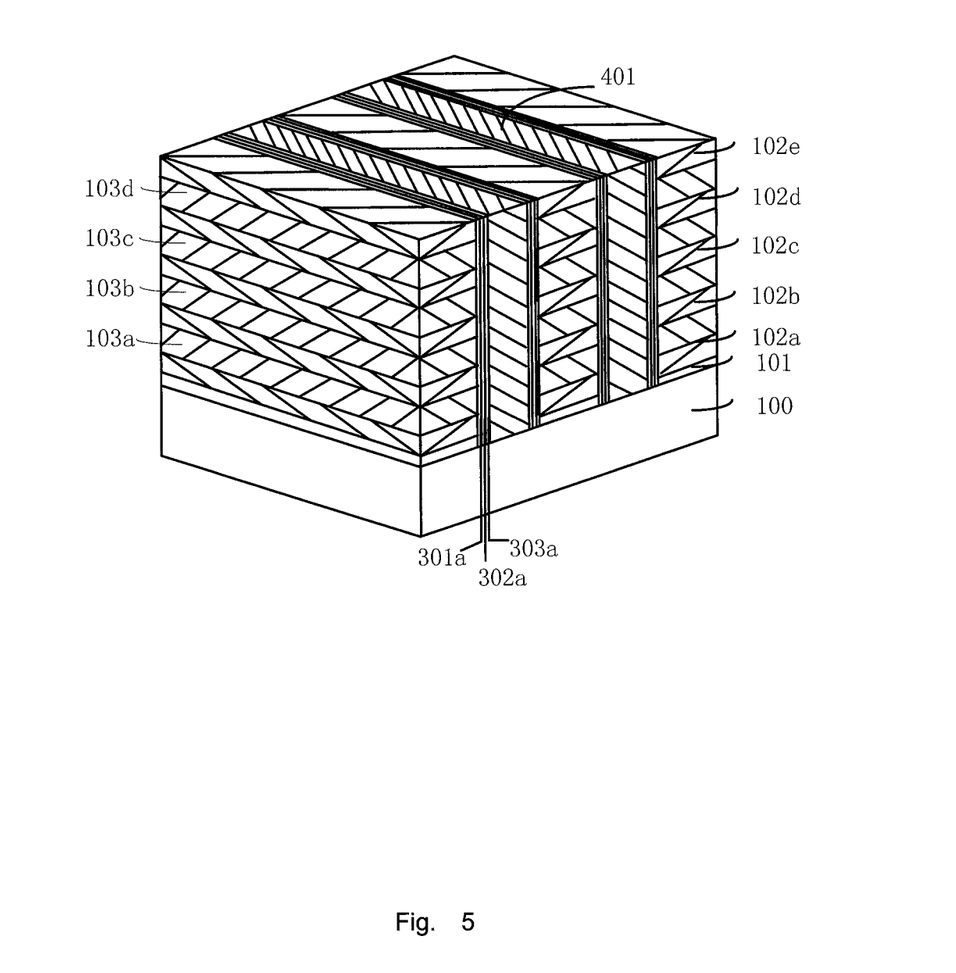
FIG. 5 is a schematic diagram illustrating a process for forming periodically arranged channel regions by depositing polysilicon in channel region spaces, each of which is sandwiched by adjacent two of tunneling dielectric layers, according to an embodiment of the present disclosure.

FIG. 5 is a schematic diagram illustrating a process for forming periodically arranged channel regions by depositing polysilicon in the channel region spaces 202, each of which is sandwiched by adjacent portions of the tunneling dielectric layer 303, according to an embodiment of the present disclosure. The polysilicon is deposited in the channel region spaces 202, each of which is sandwiched by adjacent portions of the tunneling dielectric layer 303, to completely fill the channel region spaces 202, so as to form the periodically arranged channel regions 401.

Figure 6:
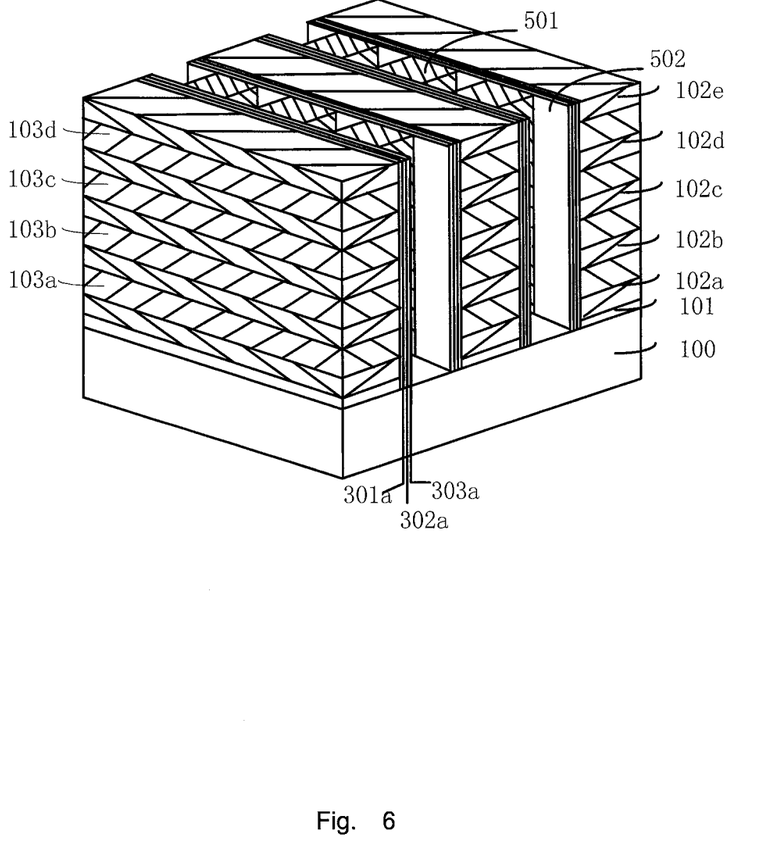
FIG. 6 is a schematic diagram illustrating a process for defining locations for source/drain doping regions by etching according to an embodiment of the present disclosure.

FIG. 6 is a schematic diagram illustrating a process for defining locations for source/drain doping regions by etching according to an embodiment of the present disclosure. Firstly, a pattern of the locations 502 for the source/drain doping regions is defined with photo resist or a hard mask, etc. Then the channel regions 401 are etched in a direction perpendicular to the channel regions until the substrate 100 is exposed, so as to form a plurality of square holes 502 arranged periodically in the channel regions 401. The square holes 502 are the locations where the source/drain doping regions will be located. Further, channel areas 501 that are not etched are remained in the channel regions 401.

Figure 7:
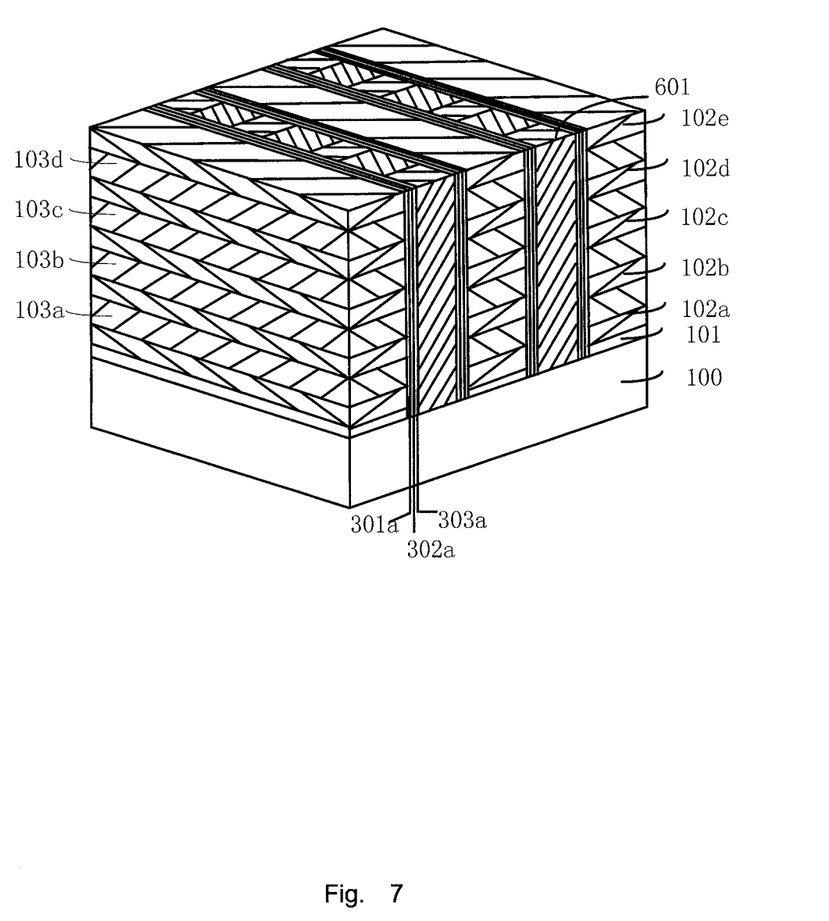
FIG. 7 is a schematic diagram illustrating a process for forming source/drain doping regions by depositing a source/drain doping material in the locations for source/drain doping regions according to an embodiment of the present disclosure.

FIG. 7 is a schematic diagram illustrating a process for forming source/drain doping regions by depositing a source/drain doping material in the locations 502 for the source/drain doping regions according to an embodiment of the present disclosure. The source/drain doping material is deposited in the locations 502 for the source/drain doping regions, to form the source/drain doping regions 601. The source/drain doping material may comprise heavily doped polysilicon, which has a doping type opposite to that of the channel regions. After the source/drain doping material is deposited, the source/drain doping material fills the locations 502 for the source/drain doping regions which are opened by etching. Then the device surface is planarized by means of chemical mechanical polishing. Because the source/drain regions have the same doping condition, the source doping regions and the drain doping regions are formed in a symmetric manner, and thus are arranged periodically along the channel regions 401.

Figure 8:
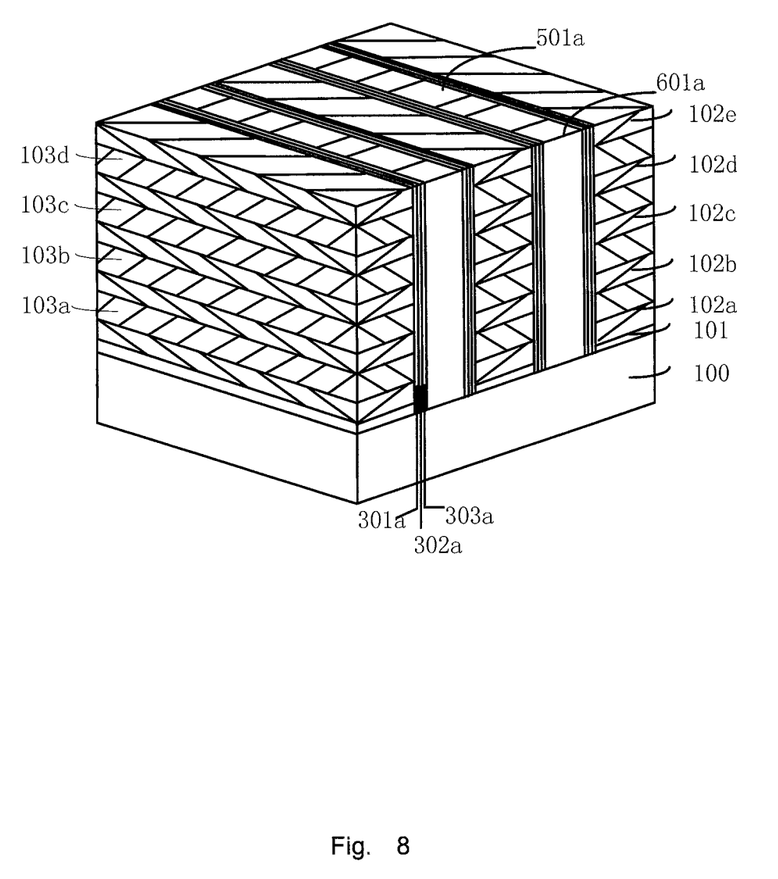
FIG. 8 is a schematic diagram illustrating a process for monocrystallizing the channel regions and the source/drain doping regions according to an embodiment of the present disclosure.

FIG. 8 is a schematic diagram illustrating a process for monocrystallizing the channel regions and the source/drain doping regions according to an embodiment of the present disclosure. Both the channel regions and the source/drain doping regions have monocrystal silicon formed therein after a thermal treatment.

Figure 9:
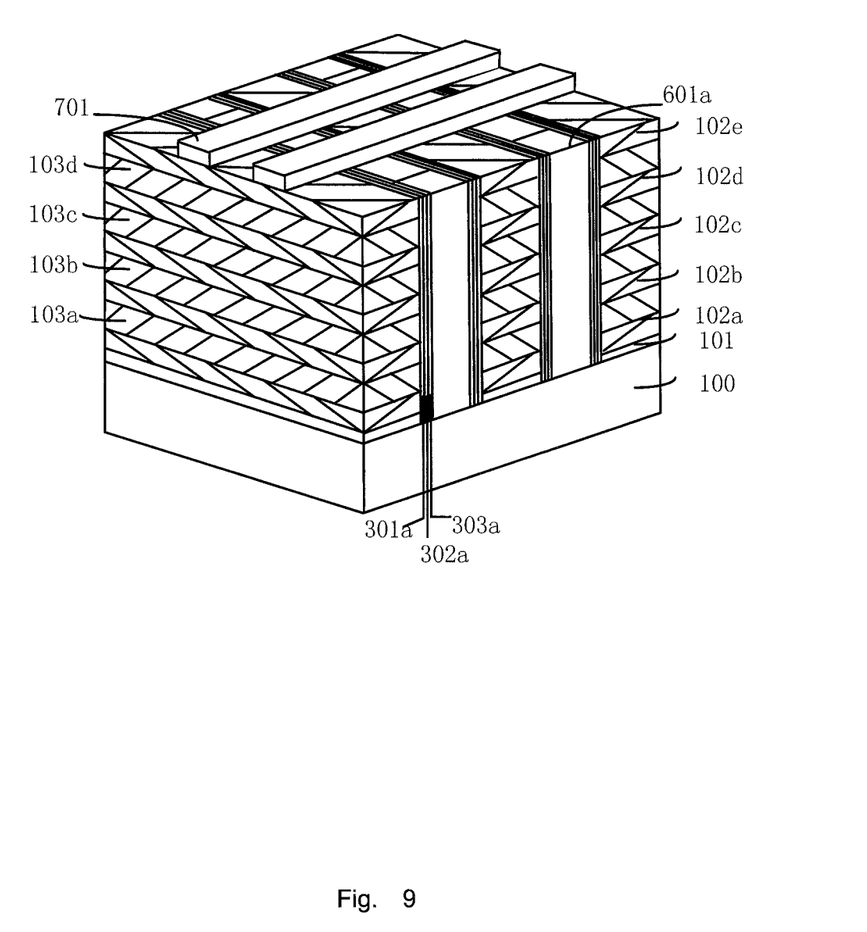
FIG. 9 is a schematic diagram illustrating a process for leading bit lines from the source/drain doping regions.

FIG. 9 is a schematic diagram illustrating a process for leading bit lines from the source/drain doping regions. The bit lines 701 are led from the source/drain doping regions and are arranged in a direction perpendicular to the channel regions, as shown in FIG. 9. The bit lines 701 may comprise any one of polysilicon, metal, metal silicide, and a stack of multiple layers that has similar properties.

Figure 10:
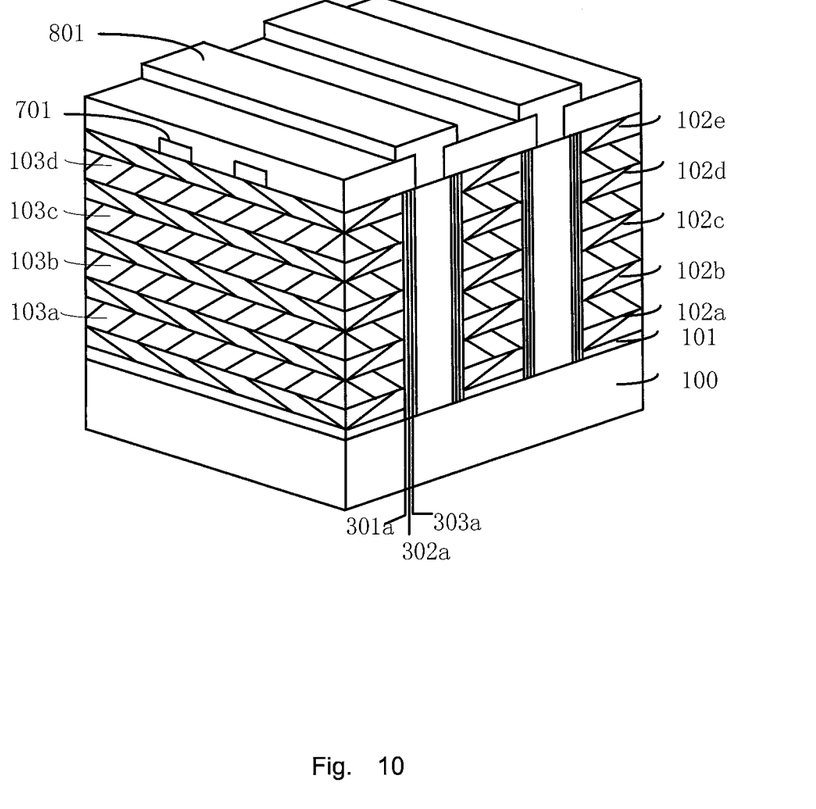
FIG. 10 is a schematic diagram illustrating a process for leading word lines from the gate stack regions.

FIG. 10 is a schematic diagram illustrating a process for leading word lines from the gate stack regions. The word lines 801 are led from the gate stack regions and are arranged in a direction parallel to the channel regions, as shown in FIG. 10. The word lines 801 may comprise any one of polysilicon, metal, metal silicide, and a stack of multiple layers that has similar properties.

Figure 11:
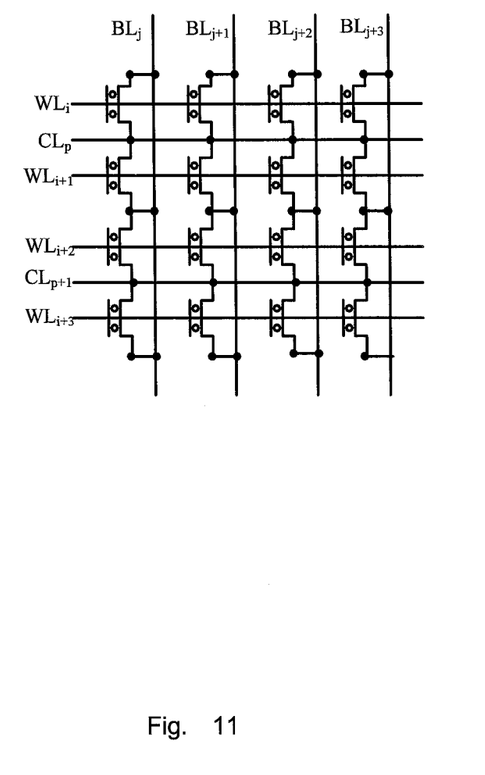
FIG. 11 is a schematic diagram illustrating a single-layer equivalent circuit of a single layer of the three-dimensional multi-bit non-volatile memory according to an embodiment of the present disclosure.
Figure 12:
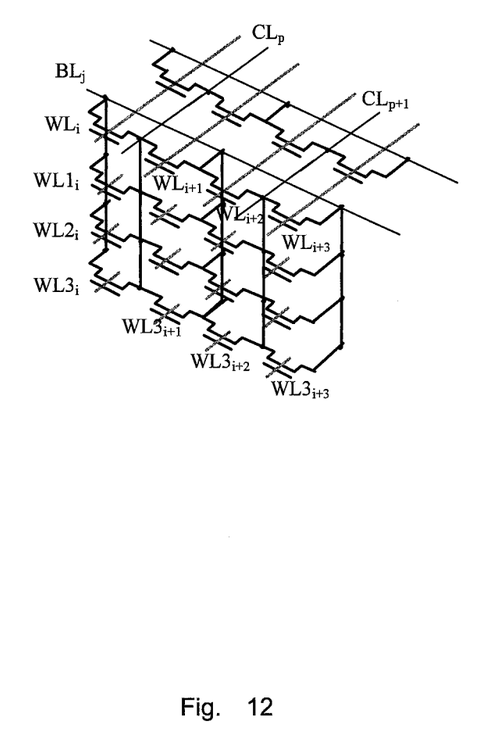
FIG. 12 is a schematic diagram illustrating a three-dimensional equivalent circuit of the three-dimensional multi-bit non-volatile memory according to an embodiment of the present disclosure.

To this end, the three-dimensional multi-bit non-volatile memory has been substantially completed. FIG. 11 is a schematic diagram illustrating a single-layer equivalent circuit of the three-dimensional multi-bit non-volatile memory according to an embodiment of the present disclosure. FIG. 12 is a three-dimensional schematic diagram illustrating an equivalent circuit of the three-dimensional multi-bit non-volatile memory according to an embodiment of the present disclosure. The three-dimensional structure improves the storage density greatly as compared with the conventional planar structure. Operations on individual memory cells shown in the figure, such as programming, erasing, and reading, can be achieved by operating the word lines $WL_i$, $WL_{i+1}$, $WL_{i+2}$ . . . and the bit lines $BL_j$, $BL_{j+1}$, $BL_{j+2}$. Further, Multi-bit operations can be achieved in each memory cell, further improving the storage density.

Referring again to FIG. 10, according to an embodiment of the present disclosure, a three-dimensional multi-bit non-volatile memory comprises a plurality of memory cells, which constitute a memory array. The memory array comprises a gate stack structure, periodically and alternately arranged gate stack regions and channel region spaces, gate dielectric layers for discrete charge storage, periodically arranged channel regions, source doping regions and drain doping regions symmetrically arranged to each other, bit lines led from the source doping regions and the drain doping regions, and word lines led from the gate stack regions. In the memory, the gate dielectric layers for discrete charge storage can provide physical storage spots to achieve single-bit or multi-bit operations, so as to achieve a high storage density.

The gate stack structure may be formed by stacking isolating dielectric layers and conductive gate layers alternately. The isolating dielectric layers may comprise silicon dioxide, and the conductive gate layers may comprise any one of polysilicon, metal, metal silicide, and a stack of multiple layers.

The symmetrically arranged source doping regions and drain doping regions have a doping type opposite to that of the channel regions. The symmetrically arranged source doping regions and drain doping regions are heavily doped in a condition substantially same as that of the channel regions. The symmetrically arranged source doping regions and drain doping regions are arranged periodically along the channel regions. The symmetrically arranged source doping regions and drain doping regions may comprise doped polysilicon or metal silicide.

The gate dielectric layers for discrete charge storage are formed on side walls of the respective gate stack regions adjacent to the respective channel regions. The gate dielectric layers for discrete charge storage may comprise a charge block layer, a charge storage layer, and a tunneling dielectric layer formed sequentially on the side walls of the respective gate stack regions. The charge block layer may comprise any one of silicon dioxide, metal oxide, and a stack of multiple layers. The charge storage layer may comprise any one of silicon nitride, a high-K material, and a stack structure. The tunneling dielectric layer may comprise any one of silicon dioxide, a high-K material, and a stack of multiple layers.

According to an embodiment of the present disclosure, processes adopted in the manufacturing of the three-dimensional multi-bit non-volatile memory may comprise any one of chemical vapor deposition, sputtering, atom layer deposition, thermal evaporation, pulse laser deposition, electron beam evaporation and any other processes that can be used to achieve the structure, such as conventional lithography, etching, surface planarization, annealing, and the like.

According to an embodiment of the present disclosure, the memory can be programmed by Channel Hot Electron Injection (CHE), in which electrons enter the charge storage layer under the gate from the substrate side. The respective memory cells in the memory can be erased by an FN gate erasing operation, in which the stored electrons tunnel from the charge storage layer into the gate stack structure of the memory array, or by Band-Band Tunneling Hot Hole Injection (BBTH), in which hot holes enter the charge storage layer from the substrate side to recombine with the electrons.

According to an embodiment of the present disclosure, the memory can be read by means of reverse reading. To be adapted to special applications, the structure described in the present disclosure may also be programmed and erased in other manners, such as direct tunneling, FN tunneling, Band-Band Tunneling Hot Hole Injection (BBTH), and the like. Due to the discrete charge storage characteristic of the charge storage layer and the symmetric arrangement of the source and drain regions, a plurality of physical storage spots can be obtained in a single device, each of which can be programmed and erased in the above-described manner. Therefore, multi-bit operations can be achieved and the storage density is improved.

According to an embodiment of the present disclosure, the multi-bit non-volatile memory has a three-dimensional structure, in which each cell has a plurality of physical storage spots due to the localized charge storage characteristic, and therefore multi-bit storage can be achieved. Due to the three-dimensional structure of the single device, the memory array can achieve three-dimensional integration, so as to greatly improve the storage density. The three-dimensional multi-bit non-volatile memory according to the present disclosure has a high density and is easy for integration. Further, it can be manufactured by existing memory manufacturing processes, which facilitates the promotion and application of the present disclosure.

According to an embodiment of the present disclosure, the localized charge storage characteristic of the charge trapping layer and the spatial characteristic of the vertical stack structure are combined to achieve a plurality of physical storage spots in a single device. In this way, the memory array achieves multi-bit storage and three-dimensional integration, which significantly improves the storage density. Meanwhile, the memory according to the present disclosure has superior programming, erasing, and holding performances. The charge trapping type multi-bit non-volatile memory according to the present disclosure is compatible with the conventional silicon based planar CMOS processes, and thus can be integrated as conventional memory arrays, which facilitates wide applications of the present disclosure.

The objects, technical solutions, and advantageous effects of the present disclosure have been explained with reference to embodiments thereof. However, the above descriptions are only specific embodiments of the disclosure, rather than limiting the scope of the disclosure. Any modifications, equivalent substitutions, and improvements within the spirit and principle of the present disclosure are intended to fall in the scope of the present disclosure.

We claim:

1. A three-dimensional multi-bit non-volatile memory, comprising a plurality of memory cells constituting a memory array, the memory array comprising:
   a plurality of first vertical columns periodically arranged in a first direction and spaced from each other, each of the first vertical columns comprising alternating isolating dielectric layers and conductive gate layers;
   gate dielectric layers for discrete charge storage formed on side walls of the first vertical columns; and
   a plurality of second vertical columns formed between adjacent pairs of the first vertical columns, wherein each of the second vertical columns comprises:
   channel regions periodically arranged in a second direction crossing the first direction;
   source doping regions and drain doping regions symmetrically arranged to each other in the second direction with respect to the respective channel regions;
   bit lines led from the source doping regions and the drain doping regions; and
   word lines led from the first vertical columns.

2. The three-dimensional multi-bit non-volatile memory according to claim 1, wherein:
   the isolating dielectric layer comprises silicon dioxide; and
   the conductive gate layer comprises any one of polysilicon, metal, metal silicide, and a stack of multiple layers.

3. The three-dimensional multi-bit non-volatile memory according to claim 1, wherein the first vertical columns are formed by etching a stack of alternating isolating dielectric layers and conductive gate layers.

4. The three-dimensional multi-bit non-volatile memory according to claim 1, wherein:
   the gate dielectric layers for discrete charge storage each comprise a charge block layer, a charge storage layer, and a tunneling dielectric layer formed in sequence on the side walls of the respective first vertical columns.

5. The three-dimensional multi-bit non-volatile memory according to claim 4, wherein:
   the charge block layer comprises any one of silicon dioxide, metal oxide, and a stack of multiple layers;
   the charge storage layer comprises any one of silicon nitride, a high-K material, and a stack of multiple layers; and
   the tunneling dielectric layer comprises any one of silicon dioxide, a high-K material, and a stack of multiple layers.

6. The three-dimensional multi-bit non-volatile memory according to claim 4, wherein: the memory is programmed by Channel Hot Electron Injection (CHE), in which electrons enter the charge storage layer under the gate from a substrate side.

7. The three-dimensional multi-bit non-volatile memory according to claim 4, wherein:
   the memory cells are erased by an FN gate erasing operation, in which stored electrons tunnel from the charge storage layer into the gate stack structure of the memory array, or by Band-Band Tunneling Hot Hole Injection (BBTH), in which hot holes enter the charge storage layer from a substrate side to recombine with electrons.

8. The three-dimensional multi-bit non-volatile memory according to claim 1, wherein:
   the channel regions are formed by depositing polysilicon to completely fill spaces between the respective first vertical columns and then patterning the deposited polysilicon.

9. The three-dimensional multi-bit non-volatile memory according to claim 1, wherein:
   the source doping regions and drain doping regions have a doping type opposite to that of the channel regions;
   the source doping regions and drain doping regions are heavily doped in a doping condition substantially same as that of the channel regions; and
   the source doping regions and drain doping regions are distributed periodically along the channel regions.

10. The three-dimensional multi-bit non-volatile memory according to claim 9, wherein:
    the source doping regions and drain doping regions comprise doped polysilicon or metal silicide.

11. A method for manufacturing the three-dimensional multi-bit non-volatile memory, comprising:
    forming a stack of alternating isolating dielectric layers and conductive gate layers on a semiconductor substrate;
    etching the stack to form a plurality of first vertical columns periodically arranged in a first direction and spaced from each other, wherein a space between adjacent pairs of the first vertical columns is called a channel region;
    depositing a charge block layer, a charge storage layer, and a tunneling layer on side walls of the respective first vertical columns, to form gate dielectric layers for discrete charge storage;
    depositing a channel layer in the channel region spaces, and etching the channel layer to form channel regions which are periodically arranged in a second direction crossing the first direction each of the channel region space;
    depositing a source/drain doping material in the channel space regions, to form source doping regions and drain doping regions symmetrically arranged to each other in the second direction with respect to the respective channel regions; and leading bit lines from the locations for source doping regions and the drain doping regions, and leading word lines from the first vertical columns, to form the three-dimensional multi-bit non-volatile memory.

12. The method for manufacturing the three-dimensional multi-bit non-volatile memory according to claim 11, wherein forming the stack on the semiconductor substrate comprises:

depositing a dielectric layer to achieve buffering and isolation on the semiconductor substrate by chemical vapor deposition; and depositing the isolating dielectric layers and the conductive gate layers alternately on the dielectric layer by chemical vapor deposition, to form the stack.

13. The method for manufacturing the three-dimensional multi-bit non-volatile memory according to claim 12, wherein:

the semiconductor substrate comprise any one of a silicon chip, a germanium-silicon chip, and a multilayer substrate including an epitaxial silicon or germanium-silicon layer;

the dielectric layer comprises silicon dioxide; and the isolating dielectric layers comprise silicon dioxide, and the conductive gate layers comprise any one of polysilicon, metal, metal silicide, or a stack of multiple layers that has similar properties.

14. The method for manufacturing the three-dimensional multi-bit non-volatile memory according to claim 11, wherein etching the stack comprises:

defining a pattern of the first vertical columns with photo resist or a hard mask; and etching the stack structure until a dielectric layer is exposed, so as to form the first vertical columns.

15. The method for manufacturing the three-dimensional multi-bit non-volatile memory according to claim 11, wherein depositing the charge block layer, the charge storage layer, and the tunneling layer on the side walls of the respective first vertical columns to form the gate dielectric layers for discrete charge storage comprises:

depositing the charge block layer, the charge storage layer, and the tunneling layer on the substrate with the first vertical columns already formed thereon;

forming the gate dielectric layers for discrete charge storage by etching the charge block layer, the charge storage layer, and the tunneling layer deposited on the substrate with the first vertical columns already formed thereon, in such a manner that an uppermost isolating dielectric layer and the substrate are exposed, while portions of the charge block layer, the charge storage layer, and the tunneling layer, which are formed in sequence on the side walls of the respective first vertical columns, are remained.

16. The method for manufacturing the three-dimensional multi-bit non-volatile memory according to claim 11, wherein depositing the channel layer in the channel region spaces comprises:

depositing polysilicon in the channel region spaces, each of which is located between adjacent portions of the tunneling dielectric layer, to completely fill the channel region spaces.

17. The method for manufacturing the three-dimensional multi-bit non-volatile memory according to claim 11, wherein etching the channel layer comprises:

defining a pattern of the source doping regions and the drain doping regions with photo resist or a hard mask;

etching the channel layer in a direction perpendicular to the substrate until the substrate is exposed, so as to form a plurality of square holes periodically arranged in the channel regions, for formation of the source doping regions and the drain doping regions.

18. The method for manufacturing the three-dimensional multi-bit non-volatile memory according to claim 11, wherein depositing a source/drain doping material in the channel region spaces comprises:

depositing the source/drain doping material in the channel regions spaces, and planarizing a surface thereof by chemical mechanical polishing, so as to form the source doping regions and the drain doping regions which are arranged symmetrically with respect to each other and periodically along the channel regions.

19. The method for manufacturing the three-dimensional multi-bit non-volatile memory according to claim 11, wherein the channel regions and the source and drain doping regions comprise polysilicon, and the method further comprises:

forming monocrystal silicon in the channel regions, the source doping regions, and the drain doping regions by a thermal treatment, after the formation of the symmetrically arranged source doping regions and drain doping regions.

20. The method for manufacturing the three-dimensional multi-bit non-volatile memory according to claim 11, wherein in the step of leading bit lines from the source doping regions and the drain doping regions, and leading word lines from the first vertical columns, to form the three-dimensional multi-bit non-volatile memory, the bit lines are led from the source doping regions and the drain doping regions and are arranged in a direction perpendicular to the channel regions, and the word lines are led from the first vertical columns and are arranged in a direction parallel to the channel regions.

21. The method for manufacturing the three-dimensional multi-bit non-volatile memory according to claim 20, wherein:

the bit lines comprise any one of polysilicon, metal, metal silicide, and a stack structure of multiple layers that has similar properties; and the word lines comprise any one of polysilicon, metal, metal silicide, and a stack structure of multiple layers that has similar properties.

* * * * *